United States Patent
Yang et al.

(10) Patent No.: US 6,897,533 B1
(45) Date of Patent: May 24, 2005

(54) MULTI-BIT SILICON NITRIDE CHARGE-TRAPPING NON-VOLATILE MEMORY CELL

(75) Inventors: Jean Yee-Mei Yang, Sunnyvale, CA (US); Yider Wu, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/247,641

(22) Filed: Sep. 18, 2002

(51) Int. Cl.⁷ .............................................. H01L 29/02
(52) U.S. Cl. ...................... 257/369; 257/316; 257/320
(58) Field of Search ................................ 257/316, 320, 257/369, 296, 365; 365/185.03

(56) References Cited

U.S. PATENT DOCUMENTS

| | | | | |
|---|---|---|---|---|
| 5,674,768 A | * | 10/1997 | Chang et al. | 438/264 |
| 5,929,480 A | * | 7/1999 | Hisamune | 257/320 |
| 6,147,904 A | * | 11/2000 | Liron | 365/185.09 |
| 6,512,274 B1 | * | 1/2003 | King et al. | 257/369 |
| 6,643,170 B2 | * | 11/2003 | Huang et al. | 365/185.03 |

* cited by examiner

*Primary Examiner*—Michael Tran
*Assistant Examiner*—Dao H. Nguyen

(57) ABSTRACT

A non-volatile multi-bit memory cell is presented which comprises a source, a drain, a channel coupling the source and the drain, and a gate with a plurality of charge trapping regions located so that a trapped charge in each charge trapping region is enabled to affect the influence of the gate voltage on the flow of electrons in the channel. The charge trapping regions are in multiple layers of oxide/nitride/oxide and there can be multiple levels of charge trapping regions. Charges are stored in the nitride layers and isolated by the oxide layers.

9 Claims, 10 Drawing Sheets

TABLE 1: POSSIBLE STATES FOR TWO CHARGE-TRAPPING LAYERS IN REGION 1

| State | 0 | 1 | 2 | 3 |
|---|---|---|---|---|
| N1 | 0 | 0 | 1 | 1 |
| N2 | 0 | 1 | 0 | 1 |

TABLE 2: POSSIBLE STATES FOR TWO CHARGE-TRAPPING LAYERS IN REGION 2

| State | 0 | 1 | 2 | 3 |
|---|---|---|---|---|
| N1 | 0 | 0 | 1 | 1 |
| N2 | 0 | 1 | 0 | 1 |

TABLE 3: POSSIBLE STATES FOR TWO CHARGE-TRAPPING LAYERS IN MIRROR-BIT CELL

| State | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Region 1 N1 | 0 | 0 | 0 | 0 | 0 | 0 | 0 | 0 | 1 | 1 | 1 | 1 | 1 | 1 | 1 | 1 |
| Region 1 N2 | 0 | 0 | 0 | 0 | 1 | 1 | 1 | 1 | 0 | 0 | 0 | 0 | 1 | 1 | 1 | 1 |
| Region 2 N1 | 0 | 0 | 1 | 1 | 0 | 0 | 1 | 1 | 0 | 0 | 1 | 1 | 0 | 0 | 1 | 1 |
| Region 2 N2 | 0 | 1 | 0 | 1 | 0 | 1 | 0 | 1 | 0 | 1 | 0 | 1 | 0 | 1 | 0 | 1 |

FIGURE 2C

MULTI-BIT SILICON NITRIDE CHARGE-TRAPPING NON-VOLATILE MEMORY CELL

FIELD OF THE INVENTION

The present invention relates to the field of semiconductor device manufacture. Specifically, the present invention pertains to a multi-bit silicon nitride trapping flash memory cell and a method and system for forming such a cell.

BACKGROUND OF THE INVENTION

As semiconductor geometries continue to become smaller and smaller, new techniques arise in achieving ever decreasing footprints for device functionality. Memory devices, especially, because there are many millions of identical cells in a single memory chip, are the focus of intensive miniaturization efforts.

Many modern memory devices use FET technology. Flash, or non-volatile, memory uses stored charges to provide the equivalent of a gate voltage a cross a source/drain channel. A memory cell voltage/current relationship is such that, when a voltage is applied between the source and drain, $V_{DS}$, a current flow, $I_{DS}$ is measurable. When a gate voltage is very low, $I_{DS}$ is low. When a gate voltage is very high, $I_{DS}$ is high, near device saturation. At so me medial gate voltage, a high los indicates an erased, "one," state and a low $I_{DS}$ indicates a written, "zero" state. This medial gate voltage is the normal threshold voltage, or $V_T$, in the erased state. A charge stored between the gate node and the channel can modulate threshold voltage, $V_T$.

As feature sizes shrink, the size of a stored charge approaches that of a single electron. One technique for shrinking the footprint of memory cells is by allowing cells to share gates and source/drain regions in a mirrored-bit arrangement. This sharing is enabled by storing more than one charge in a single shared charge-trapping layer. Each charge affects the current flow in one direction or polarity more than the other so the source and drain can swap roles depending on which bit of the mirrored-bit cell is being read.

However, as mirrored bit cells shrink, they approach their theoretical size limits. Further, making them smaller requires that the separated regions of the common charge trapping layer be moved closer together, thereby reducing the probability of distinguishing between them. A need exists then for a means of reducing the requisite memory cell footprint while maintaining a distinction between stored charges. Furthermore, any such device should be able to be fabricated using existing semiconductor fabrication processes.

SUMMARY OF THE INVENTION

The present invention provides a non-volatile multi-bit memory cell and a method for forming the non-volatile multi-bit memory cell. The non-volatile multi-bit memory cell and the formation method are compatible with newer semiconductor fabrication techniques.

A non-volatile multi-bit memory cell is presented which comprises a source (121), a drain (122), a channel (123) coupling the source and the drain, and a gate (108) with a plurality of charge trapping regions (104,106) located so that a trapped charge in each charge trapping region is enabled to affect the influence of the gate voltage on the flow of electrons in the channel (123). The charge trapping regions are in multiple layers of oxide/nitride/oxide and there can be multiple levels of charge trapping regions. Charges are stored in the nitride layers but are isolated by the oxide layers.

These and other objects and advantages of the present invention will become obvious to those of ordinary skill in the art after having read the following detailed description of the preferred embodiments which are illustrated in the various drawing figures.

BRIEF DESCRIPTION OF THE DRAWINGS

The operation of this invention can be best visualized by reference to the drawings.

FIG. 2C illustrates a cross-section of a charge-trapping region in a semiconductor in accordance with one embodiment oft present invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail so as not to unnecessarily obscure aspects of the present invention.

Figure 1:
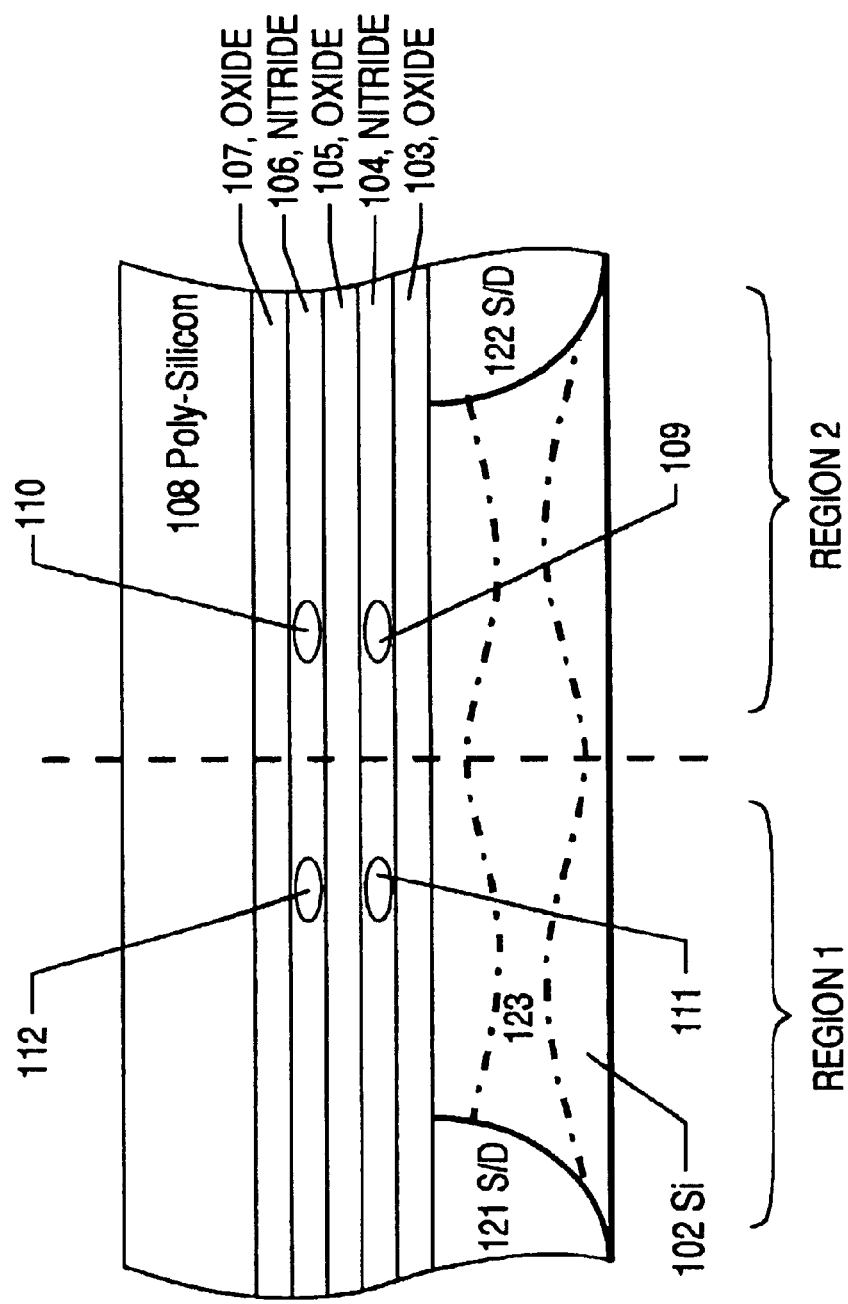
FIG. 1 illustrates a semiconductor cross-section in accordance with one embodiment of the present invention.

An embodiment of the present invention can best be seen by reference to FIG. 1. A non-volatile memory cell, 100, using oxide-nitride-oxide (ONO) for charge trapping is shown. A charge, an example of which is indicated by 109, is trapped in nitride layer 104 which is sandwiched between top and bottom oxide insulating layers, 103 and 105, respectively. Note that the embodiment of the present invention illustrated in FIG. 1 shows charge 109 and charge 111 trapped in the same nitride layer. A memory cell that can trap two charges in a single charge trapping layer and share source/drain regions 101 is called, in this embodiment, a mirror bit cell.

In one embodiment of the present invention, multiple levels of charge-trapping layers are used to produce a multi-layered mirrored memory bit structure. As shown in FIG. 1, in one embodiment, an additional nitride layer 106 is placed in the stack and insulated by first oxide layer 105 and second oxide layer 107 to form a multi-bit cell. Additionally, in the present embodiment, the multi-layered memory device also has a "mirror-bit" configuration. That is, each charge trapping layer has a plurality of regions for trapping charges therein. Although a mirror-bit configuration is recited in the present embodiment, the present invention is also well suited to use with a "non-mirror-bit" configuration in which each charge trapping layer is adapted to store a charge in only a single region. Other embodiments may employ "ONONONO," indicating three charge-trapping layers. In other embodiments, even higher stacking of the ONO sandwiches are employed. In these embodiments, a sufficient distinction must be determined between different threshold voltages, $V_T$, for each cell state. Gate region 108 is also, in this embodiment, shared between each of the charge trapping layers a nd regions.

In some embodiments, a memory cell is much like a field effect transistor in that Gate/Source voltage, $V_{GS}$, controls the relationship of source/drain voltage, $V_{DS}$, and source/drain current, $I_{DS}$, through channel 123 between the source 121 and the drain 122. A typical relationship between $V_{DS}$ and $I_{DS}$ is shown in curve 204 in FIG. 2. By trapping a charge in a charge-trapping layer between a gate and a source and drain, the behavior of the source/drain current in relation to a source drain voltage $V_{DS}$ can be measured, making for a "read" operation. In one embodiment of the present invention, if $I_{DS}$ is large for a fixed $V_{DS}$ and $V_{GS}$, an "erased" or "one" state is indicated. If $I_{DS}$ is small for a fixed $V_{DS}$ and $V_{GS}$ a "written" or "zero" state is indicated.

It must be noted here that a mirror bit cell is one in which stored charges affect the test-voltage/read-current relationship differently, depending on polarity. Because of the polarity difference of the voltage applied across channel 123, depending on which region, 121 or 122, is used as a source and which is a drain, the mirrored bit states can be distinguished, essentially achieving the function of two memory cells within the hardware real estate of one.

Figure 2A:
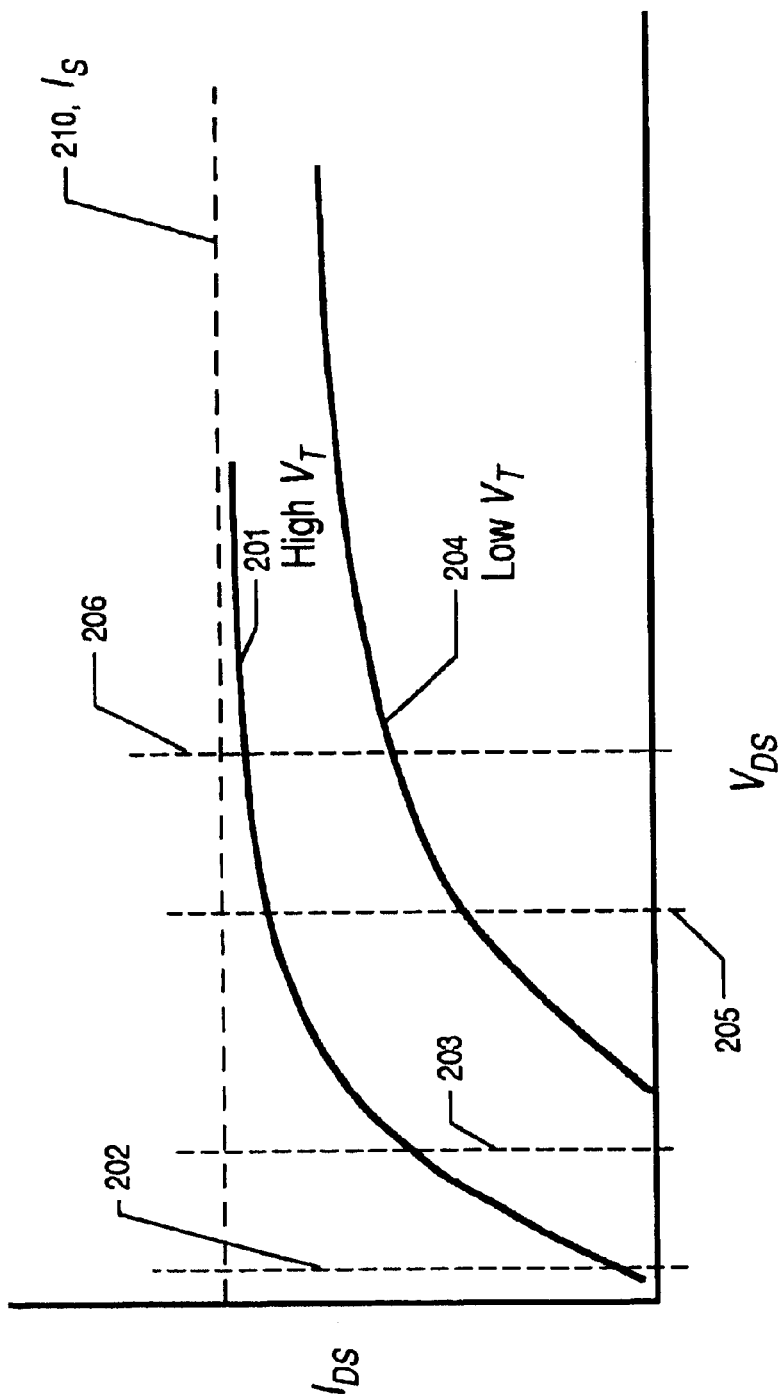
FIG. 2A illustrates a current/voltage curve in accordance with one embodiment of the present invention.

A memory cell voltage/current relationship is illustrated in FIG. 2A. An example is shown for one half of a mirror bit cell. Curve 201 illustrates the behavior of an unwritten or "one" state cell. Curve 204 illustrates the behavior of the same cell with a stored charge; the written or "zero" state. When a voltage is applied between the source and drain, $V_{DS}$, a current flow, $I_{DS}$, is measurable. When a $V_{DS}$ less than something on the order of that shown at 203, $I_{DS}$ is low in both states. When a $V_{DS}$ larger than something on the order of that shown at 206, $I_{DS}$ is high, near device saturation, in both states. When a $V_{DS}$ less than that indicated at 205 and greater than that at 203 is applied, a high IDS indicates an erased, "one," state and a low IDS indicates a written, "zero," state. These behaviors exist when the gate (area 108 in FIG. 1) remains at a fixed voltage. In that case, a stored charge modulates threshold voltage, $V_T$. $I_S$, 210, indicates a saturation current, peculiar to an individual device. Achieving currents significantly greater than $I_S$ can result in device destruction and is usually only achievable with very large relative voltages. Note that in the multi-bit embodiment discussed here, multiple stored charges provide multiple $V_T$ levels. A $V_{DS}$ level, above and below which different states can be determined is the threshold voltage, $V_T$.

Figure 2B:
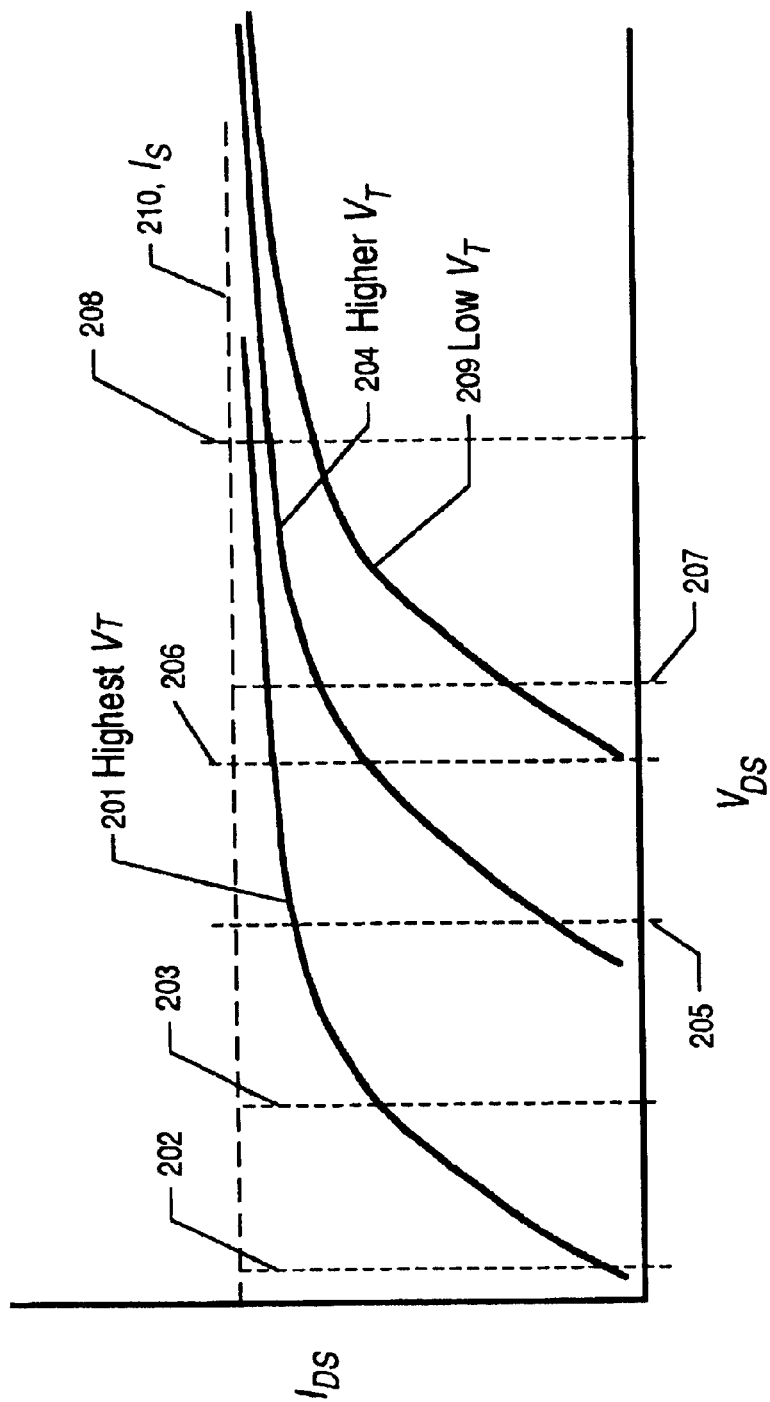
FIG. 2B illustrates a current/voltage curve in accordance with one embodiment of the present invention.

FIG. 2B illustrates a voltage/current relationship in a multi-bit memory cell as in the embodiment of the present invention discussed here. In addition to curves 201 and 204, curve 209 indicates the behavior of a multi-bit cell when two cell levels as shown in FIG. 1 are written. With each additional stored charge, the apparent $V_T$ is higher, resulting in a higher required $V_{GS}$ for any given $I_{DS}$, thus distinguishing each separate state.

In the exemplary embodiment illustrated in FIG. 2B, the $V_T$ to distinguish between the "two" state of curve 201 and the "zero" state of curve 204 is between voltages 203 and 205. The distinguishing $V_T$ to discern between the "one" state and the "zero" state of curve 209 is between voltage 206 and 207. Any $V_T$ greater than that of 208 indicates a "zero" state. Embodiments of the present invention can be implemented with more than two charge-trapping layers and thus more than three states. The requirement is that $V_T$ distinctions be discernable between the written states.

Writing to a cell in this embodiment of the present invention requires a voltage between gate 108 and channel 123. Writing to level 106 requires a higher energy "hot electron" insertion than writing to level 104. Writing to higher levels requires even higher energies. By distinguishing the insertion energies, hot electron insertion is controlled to write to each level, producing individual, selectively programmed, states. Once written to, or erased from, the bits in the cell in these embodiments remain in the assigned state without additional power requirements. Since gate 108 is floating during read operations, bit states are unaffected by $V_{DS}$.

FIG. 2C illustrates state tables for one embodiment of the present invention. In this embodiment, two charge-trapping layers are implemented in two charge trapping regions of a mirror-bit cell. Table 1 illustrates the available states for Region 1 of this embodiment. Note that a "1" indicates a stored charge in a nitride layer and a "0" indicates a lack of a stored charge. "N1" refers to first nitride layer 104 and "N2" refers to second nitride layer 106. There are four possible states for Region 1. There are also four possible states for Region 2 as illustrated in Table 2. The combination of states for the entire cell is illustrated in Table 3. In Table 3, a total of sixteen states are possible. Other embodiments of the present invention are implemented with more layers with multiplying the previous number of possible states by four.

Figure 3:
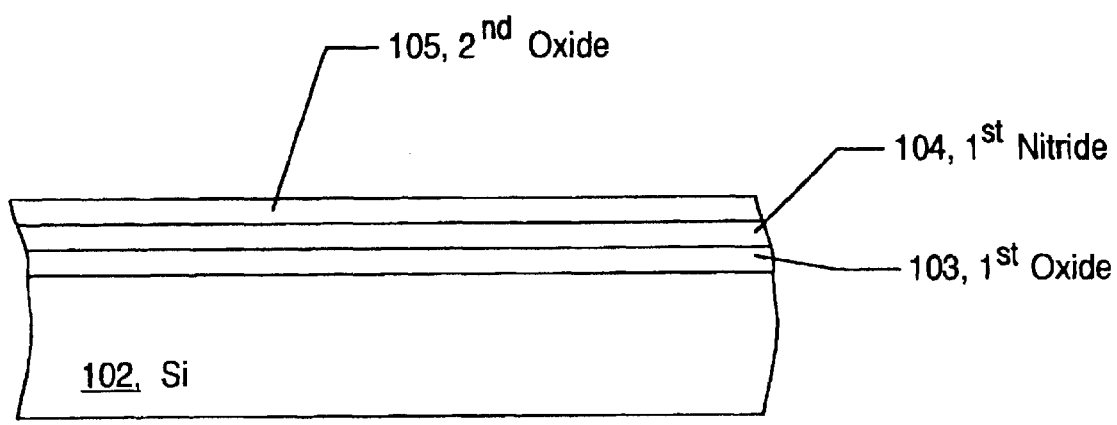
FIG. 3 illustrates charge-trapping layer formation in a semiconductor in accordance with one embodiment of the present invention.

Fabricating an embodiment of the present invention can be illustrated by referring to FIGS. 3 through 8. FIG. 3 illustrates a section of semiconductor substrate 102, usually silicon. The first charge trapping layer is formed on the substrate by applying insulating layer 103, usually formed of a silicon oxide, then applying layer 104, usually silicon nitride, then applying another insulating layer 105, again an oxide. The oxide/nitride/oxide sandwich is referred to in shorthand as "ONO." This embodiment of the present invention employs "ONONO" layering, or even "ONONONO."

Figure 4:
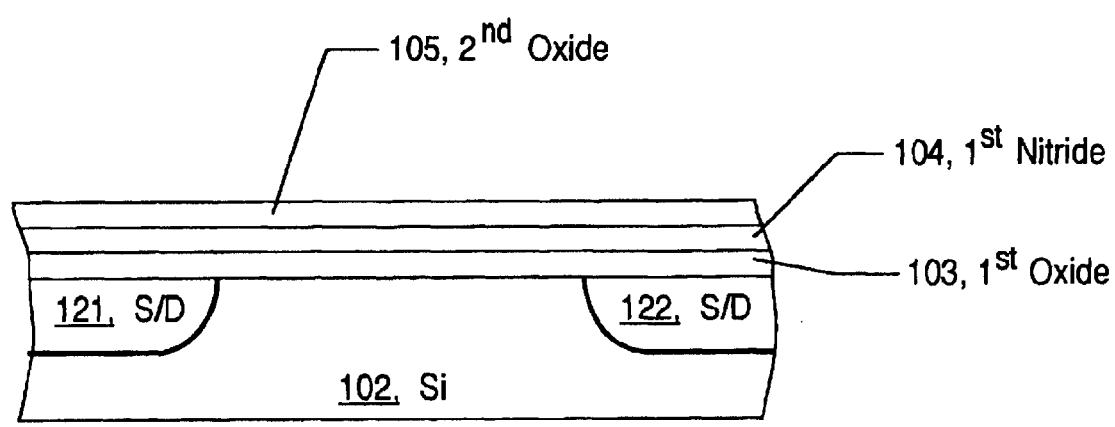
FIG. 4 illustrates source/drain region formation in a semiconductor in accordance with one embodiment of the present invention.
Figure 5:
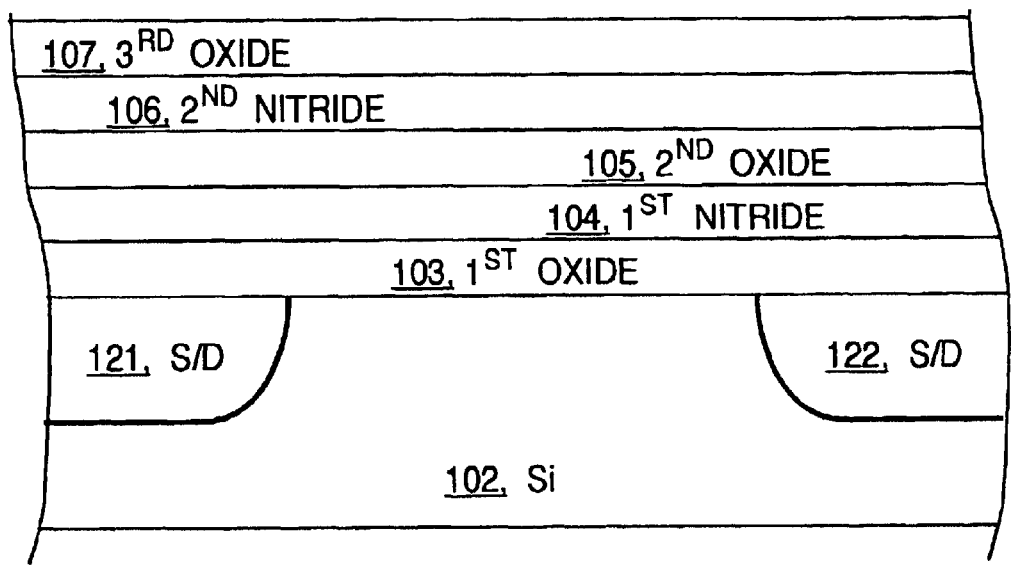
FIG. 5 illustrates charge-trapping layer formation in a semiconductor in accordance with one embodiment of the present invention.
Figure 6:
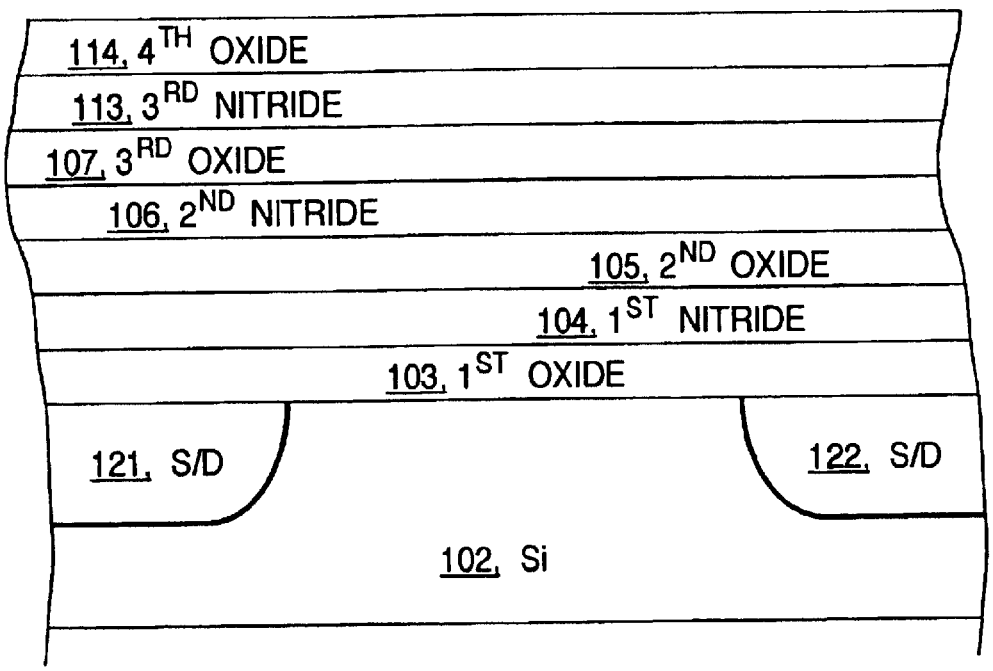
FIG. 6 illustrates additional charge-trapping layer formation in a semiconductor in accordance with one embodiment of the present invention.
Figure 7:
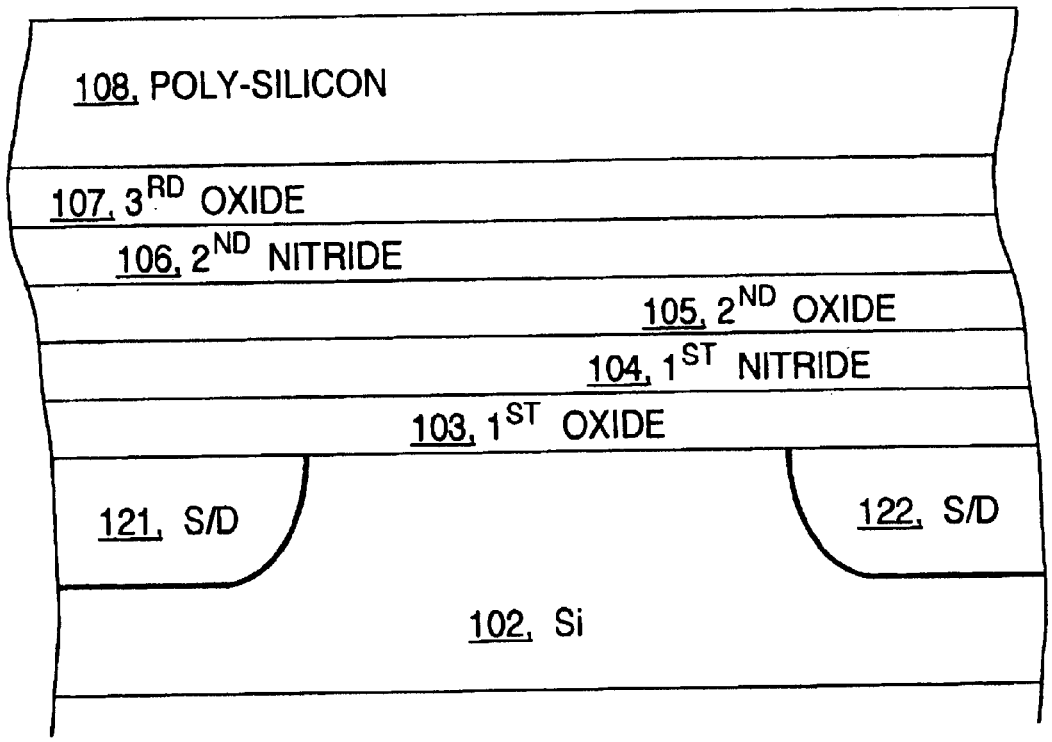
FIG. 7 illustrates poly-silicon gate application in a semiconductor in accordance with one embodiment of the present invention.

The source and drain regions, 121 and 122, are formed at this stage by ion implantation or other known method as illustrated in FIG. 4. FIG. 5 illustrates the addition of a second charge trapping sandwich. Since insulating oxide layer 105 is already in place, trapping nitride layer 106 can be laid directly on layer 105. Then insulating layer 107 is applied. Embodiments of the invention may use more than two charge-trapping layers as shown in FIG. 6. In that case further layers would be applied at this point in the process. After all required ONO layers are applied, gate region 108 is applied as shown in FIG. 7. Gate region 108 is usually formed of poly-silicon.

Figure 8:
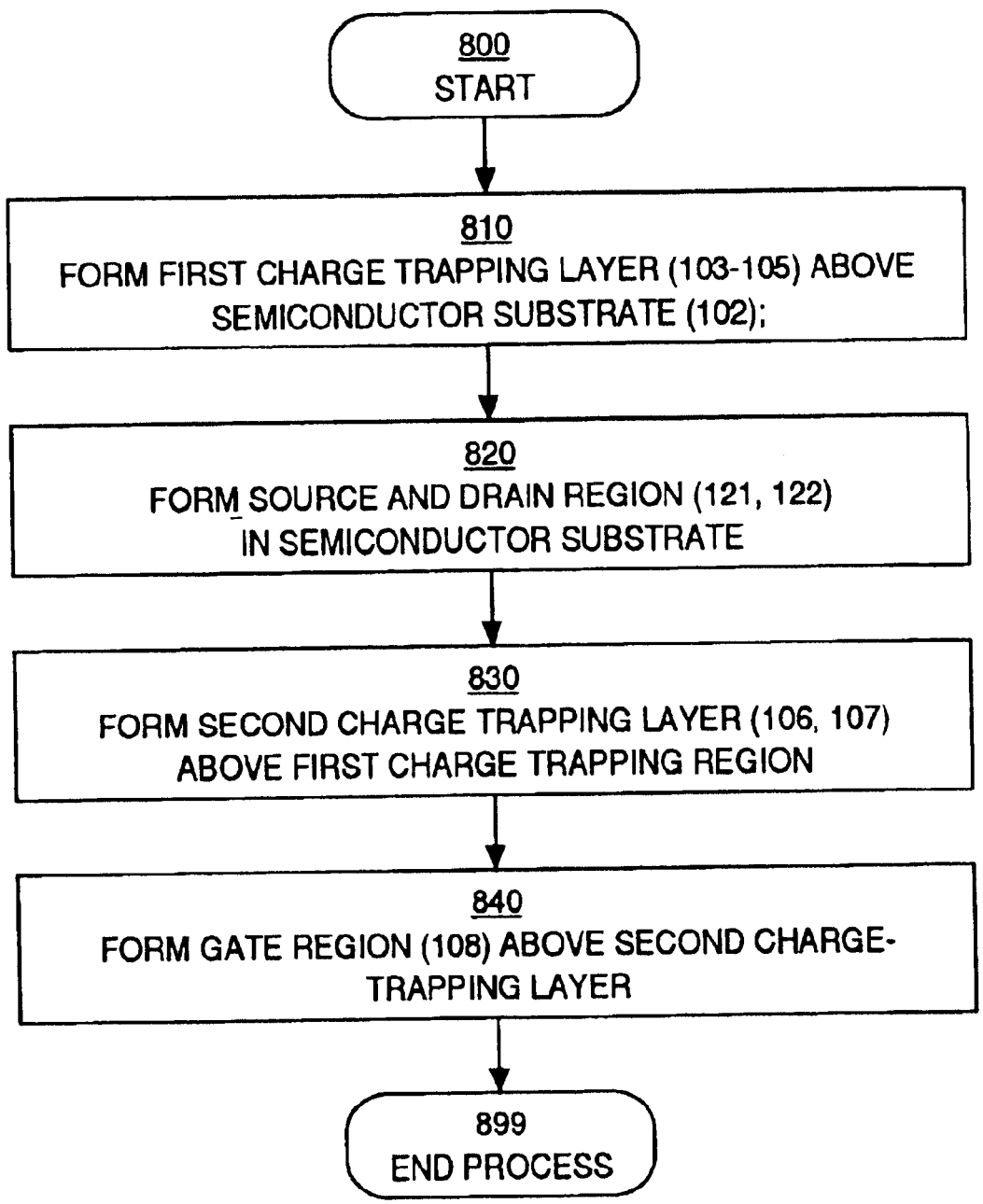
FIG. 8 illustrates a flow diagram of a semiconductor fabrication process in accordance with one embodiment of the present invention.

FIG. 8 illustrates the device formation process in flow diagram form. The process starts at 800 by applying the first charge-trapping region to the substrate at 810. At 820, the source and drain regions are formed by ion implantation or by other known means. At 830 a second charge-trapping layer is applied. Charge-trapping layers are capped by a poly-silicon gate at 840 and the process is ended at 899.

By incorporating more than one charge trapping region between the gate and the source/drain, this embodiment of the present invention can achieve multiple states with multiple current levels available on a read operation. By incorporating multiple bit storage levels in a mirror-bit memory cell, this embodiment of the present invention allows many memory states in the footprint of a single cell, performing the functions of many cells. By way of example, the mirror bit, two layer cell illustrated in FIG. 1 is capable of storing nine separate memory states. Usage techniques may produce functionally even higher numbers of states.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A non-volatile multi-bit memory cell, comprising:
    a source;
    a channel coupled to said source;
    a drain coupled to said channel;
    a gate coupled to said source and said drain, said gate disposed so as to affect electrical flow in said channel;
    a first charge trapping layer vertically disposed over said channel that is capable of trapping two charges for affecting the influence of said gate on said electrical flow in said channel; and
    a second charge trapping layer vertically disposed over said first charge trapping layer that is capable of trapping two charges for affecting the influence of said gate on said electrical flow in said channel.

2. The non-volatile multi-bit memory cell of claim 1, further comprising:
    a third charge trapping layer vertically disposed over said second charge trapping layer that is capable of trapping two charges for affecting the influence of said gate on said electrical flow in said channel.

3. The non-volatile multi-bit memory cell of claim 1, wherein said memory cell is implemented as a mirror-bit cell.

4. The non-volatile multi-bit memory cell of claim 1, wherein said first charge trapping layer comprises:
    a first layer of oxide vertically disposed over said channel;
    a first layer of nitride vertically disposed over said first layer of oxide; and
    a second layer of oxide vertically disposed over said first layer of nitride.

5. The non-volatile multi-bit memory cell of claim 4, wherein said second charge trapping layer comprises:
    said second layer of oxide;
    a second layer of nitride vertically disposed over said second layer of oxide; and
    a third layer of oxide vertically disposed over said second layer of nitride.

6. The non-volatile multi-bit memory cell of claim 5, wherein said first, second, and third layers of oxide are comprised of an oxide of silicon.

7. The non-volatile multi-bit memory cell of claim 5, wherein said first and second layers of nitride are comprised of a nitride of silicon.

8. The non-volatile multi-bit memory cell of claim 1, wherein said first and second charge trapping layers differ in programming voltage level.

9. The non-volatile multi-bit memory cell of claim 1, wherein said first and second charge trapping layers differ in erasing voltage level.

* * * * *